(12) United States Patent
Kyung

(10) Patent No.: US 8,054,704 B2
(45) Date of Patent: Nov. 8, 2011

(54) SEMICONDUCTOR MEMORY DEVICE HAVING A REDUNDANCY MEMORY CELL ARRAY

(75) Inventor: Ki-Myung Kyung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 286 days.

(21) Appl. No.: 12/490,881

(22) Filed: Jun. 24, 2009

(65) Prior Publication Data

US 2010/0290297 A1    Nov. 18, 2010

(30) Foreign Application Priority Data

May 13, 2009    (KR) .......................... 10-2009-0041593

(51) Int. Cl.
*G11C 29/00*    (2006.01)
(52) U.S. Cl. ................................. 365/200; 365/230.06
(58) Field of Classification Search .................. 365/200, 365/230.06, 63
See application file for complete search history.

(56) References Cited

U.S. PATENT DOCUMENTS

| | | | |
|---|---|---|---|
| 6,597,607 B2 * | 7/2003 | Koshita | 365/200 |
| 2006/0098503 A1 * | 5/2006 | Jeong et al. | 365/200 |
| 2007/0268761 A1 * | 11/2007 | Singh | 365/200 |
| 2008/0298154 A1 * | 12/2008 | Mae | 365/222 |

FOREIGN PATENT DOCUMENTS

| | | |
|---|---|---|
| KR | 100196515 | 6/1999 |
| KR | 100735836 | 7/2007 |
| KR | 1020070069745 | 7/2007 |
| KR | 1020080016475 | 2/2008 |

OTHER PUBLICATIONS

Notice of Preliminary Rejection issued from Korean Intellectual Property Office on Nov. 11, 2010.
Notice of Allowance issued from Korean Intellectual Property Office on Jun. 3, 2011.

* cited by examiner

*Primary Examiner* — Vu Le
(74) *Attorney, Agent, or Firm* — IP & T Group LLP

(57) ABSTRACT

A semiconductor memory device includes a plurality of memory cell mats each comprising a plurality of normal memory cell arrays; and a redundancy memory cell array configured to replace a defective memory cell with a plurality of redundancy memory cells corresponding to a redundancy word line when the redundancy word line corresponding to one or more redundancy memory cell arrays is activated in response to an address corresponding to the defective memory cell among the plurality of normal memory cell arrays.

7 Claims, 3 Drawing Sheets

SEMICONDUCTOR MEMORY DEVICE HAVING A REDUNDANCY MEMORY CELL ARRAY

CROSS-REFERENCE TO RELATED APPLICATIONS

The present invention claims priority of Korean Patent Application No. 10-2009-0041593, filed on May 13, 2009, the disclosure of which is incorporated herein by reference in its entirety.

BACKGROUND OF THE INVENTION

The present invention relates to a semiconductor design technology, and more particularly, to a semiconductor memory device that performs a data access operation by replacing a defective memory cell with a normal redundancy memory cell.

With rapid increase in integration density of semiconductor memory devices including double data rate (DDR) synchronous dynamic random access memory (SDRAM), tens of millions of memory cells are integrated into a single semiconductor memory device. Such memory cells constitute memory cell arrays arranged uniformly, and those groups are called a memory cell mat.

If a fail occurs in a memory cell in a semiconductor memory device, the semiconductor memory device may not normally perform a desired operation. As the fabrication technology of semiconductor memory devices has been advanced, defects occur in a very small number of memory cells. Thus, if semiconductor memory devices are discarded as defective items when defects occur in few memory cells, product yield suffers. To overcome such problems, redundancy memory cells are further provided within semiconductor memory devices, separately from normal memory cells. When defects occur in normal memory cells, those memory cells are replaced with the redundancy memory cells. Hereinafter, memory cells that must be replaced with the redundancy memory cells due to their defects will be referred to as "defective memory cells".

Meanwhile, memory cell architectures of the semiconductor memory devices may be classified into a folded bit line architecture and an open bit line architecture.

In the case of the folded bit line architecture, an active bit line (for example, a bit line) driving data, and a reference bit line (for example, a complementary bit line) are disposed in the same memory cell mat, with respect to a bit line sense amplifier disposed in a core region of the semiconductor memory device. Thus, the same noises are reflected on the bit line and the complementary bit line, and such noises offset each other. Due to such an offset effect, the folded bit line architecture ensures a stable operation with respect to noises. On the other hand, in the case of the open bit line architecture, a bit line and a complementary bit line are disposed in different memory cell mats, with respect to a bit line sense amplifier. Thus, noise occurring in the bit line is different from noise occurring in the complementary bit line, and the open bit line architecture is vulnerable to noises.

The folded bit line architecture is designed to have an 8F2 unit memory cell structure, and the open bit line architecture is designed to have a 6F2 unit memory cell structure. Those unit memory cell structures are a factor in determining the size of the semiconductor memory device. In comparison with the same data storage capacity, the semiconductor memory device having the open bit line architecture can be designed to be smaller in size than the semiconductor memory device having the folded bit line architecture.

Meanwhile, the semiconductor memory device stores or outputs data according to commands requested by a central processing unit (CPU) or the like. When a data access operation is requested by the CPU, a word line corresponding to a row address is activated, and a signal corresponding to a column address is activated. Then, the data access operation is performed on a corresponding memory cell. Semiconductor memory devices may have a different number of word lines. However, the number of word lines typically corresponds to the number of bit lines. For example, when the number of address bits is m, the semiconductor memory device is designed to have $2^m$ word lines (where m is a natural number). Thus, the number of word lines corresponding to a single memory cell mat may be 256, 512, and so on. In this case, the number of word lines corresponds to the umber of memory cell arrays.

In the case of the open bit line architecture, however, the number of word lines corresponding to a single memory cell mat is designed to be in a range of greater than $2^n$ and less than $2^{n+1}$ (where n is a natural number), for example, 384 or 420, considering the operating margin of the bit line sense amplifier, noise, and design efficiency. Therefore, compared with the folded bit line architecture designed to have $2^m$ word lines, the open bit line architecture has unused memory cell arrays, that is, dummy memory cell arrays. The dummy memory cell arrays are included in the memory cell mat, but they are designed separately from $2^m$. The word lines connected to the dummy memory cell arrays are commonly grounded and are unused.

FIG. 1 illustrates a memory cell array architecture of a conventional semiconductor memory device.

Referring to FIG. 1, the semiconductor memory device includes a normal memory cell array in which a plurality of memory cells are arranged. For illustration purposes, the side above a bit line sense amplifier block 150 will be referred to as an even memory cell mat 110, and the side below the bit line sense amplifier block 150 will be referred to as an odd memory cell mat 130. The bit line sense amplifier block 150 includes a plurality of bit line sense amplifiers SA.

The even memory cell mat 110 and the odd memory cell mat 130 include a plurality of word lines WL, and a specific word line WL is activated in response to a data access operation, for example, a read or write operation. The bit line sense amplifier SA is connected to a bit line BLT and a complementary bit line BLB, and senses and amplifies a voltage difference between the bit line BLT and the complementary bit line BLB.

Another bit line sense amplifier block (not shown) performing the same function as the bit line sense amplifier block 150 is arranged above the even memory cell mat 110 and connected to the complementary bit lines BLB arranged in the even memory cell mat 110. Moreover, another bit line sense amplifier block (not shown) is arranged below the odd memory cell mat 130 and connected to the bit lines BLT arranged in the odd memory cell mat 130.

The data access operation of the semiconductor memory device illustrated in FIG. 1 will be described below.

When one word line WL is activated in the data access operation, the normal memory cell array connected to the activated word line WL is activated. That is, the normal memory cells connected to the activated word line WL are activated, and data stored in the normal memory cells are transferred to the corresponding bit lines.

If the word line WL provided in the even memory cell mat 110 is activated, data of the normal memory cells are transferred through the corresponding bit lines BLT to the bit line sense amplifier block 150. In this case, the complementary bit lines BLB provided in the odd memory cell mat 130 serve as a reference in sensing and amplifying the data transferred through the bit lines BLT. On the contrary, if the word line WL provided in the odd memory cell mat 130 is activated, data of the normal memory cells are transferred through the corresponding complementary bit lines BLB to the bit line sense amplifier block 150. In this case, the bit lines BLT provided in the even memory cell mat 110 serve as a reference in sensing and amplifying the data transferred through the complementary bit lines BLB.

FIG. 2 illustrates a dummy memory cell array and a redundancy memory cell array of a conventional semiconductor memory device.

Referring to FIG. 2, the semiconductor memory device includes a normal memory cell array 210, a dummy memory cell array 230, and a redundancy memory cell array 250. The normal memory cell array 210 and the dummy memory cell array 230 are designed within one memory cell mat, and the redundancy memory cell array 250 is designed separately from the memory cell mat. The dummy memory cell array 230 is provided separately from the address bits. A memory cell array corresponding to four dummy word lines DWL is exemplified in FIG. 2. The dummy word lines DWL of the dummy memory cell array 230 are connected to the ground terminal VSS.

The redundancy memory cell array 250 is provided for replacing defective memory cells among the normal memory cells. A memory cell array corresponding four redundancy word lines RWL is exemplified in FIG. 2. When the redundancy word lines RWL are activated, the corresponding redundancy memory cells of the redundancy memory cell array 250 are activated to transfer data through the bit lines BLT and the complementary bit lines BLB.

An operation of repairing a defective memory cell in the semiconductor memory device of FIG. 2 will be described below. For illustration purposes, it is assumed that the normal memory cell array 210 includes a defective memory cell.

When an address corresponding to a defective memory cell is applied in a data access operation, the semiconductor memory device activates a redundancy word line RWL corresponding to the address, instead of a word line WL corresponding to the address. Therefore, the data access operation corresponding to the address is performed on the redundancy memory cell included in the redundancy memory cell array 250 operating normally, instead of the defective memory cell included in the normal memory cell array 210. That is, since four redundancy word lines RWL are provided in FIG. 2, four defective memory cells that may occur in the normal memory cell array 210 can be replaced with four redundancy memory cells.

The dummy word lines DWL of the dummy memory cell array 230 are connected to the ground terminal VSS and, as mentioned above, no data access operation is performed on the dummy memory cell array 230.

Meanwhile, semiconductor memory devices has been manufactured for low power and high integration. Hence, voltages applied to semiconductor memory devices get lower, and capacitances of memory cells get smaller. As a result, memory cell characteristics related to a sensing margin or refresh are degraded. Those limitations may be solved by designing the memory cell having a large capacitance. However, this approach is not suitable because such a design will increase the size of the semiconductor memory device.

SUMMARY OF THE INVENTION

An embodiment of the present invention is directed to providing a semiconductor memory device capable of ensuring relatively sufficient capacitance of a redundancy memory cell.

Another embodiment of the present invention is directed to providing a semiconductor memory device capable of replacing a defective memory cell by using a redundancy memory cell array and an existing unused dummy memory cell array.

In accordance with an aspect of the present invention, there is provided a semiconductor memory device including a plurality of memory cell mats each comprising a plurality of normal memory cell arrays; and a redundancy memory cell array configured to replace a defective memory cell with a plurality of redundancy memory cells corresponding to a redundancy word line when the redundancy word line corresponding to one or more redundancy memory cell arrays is activated in response to an address corresponding to the defective memory cell among the plurality of normal memory cell arrays.

In accordance with another aspect of the present invention, there is provided a semiconductor memory device having a number of a plurality of memory cell mats each having memory cells with the number being greater than $2^n$ and less than $2^{n+1}$ (where n is a natural number), the semiconductor memory device including a first redundancy memory cell array comprising a plurality of first memory cell arrays included in the plurality of memory cell mats, and configured to replace a first defective memory cell with a plurality of first redundancy memory cells corresponding to a first redundancy word line when the first redundancy word line corresponding to two or more first memory cell arrays among the plurality of first memory cell arrays is activated in response to an address corresponding to the first defective memory cell; and a second redundancy memory cell array comprising a plurality of second memory cell arrays that are not included in the plurality of memory cell mats, and configured to replace a second defective memory cell with a plurality of second redundancy memory cells corresponding to a second redundancy word line when the second redundancy word line corresponding to two or more second memory cell arrays among the plurality of second memory cell arrays is activated in response to an address corresponding to the second defective memory cell.

When the redundancy memory cell is accessed, two or more redundancy word lines are activated, thereby ensuring relatively sufficient capacitance of the redundancy memory cell. Moreover, in order to make the number of defective memory cells equal to that of the prior art, the defective memory cells are replaced with the existing unused dummy memory cell arrays. Hence, as many defective memory cells as the prior art can be replaced with the normal memory cells.

DESCRIPTION OF SPECIFIC EMBODIMENTS

Other objects and advantages of the present invention can be understood by the following description, and become apparent with reference to the embodiments of the present invention.

Figure 3:
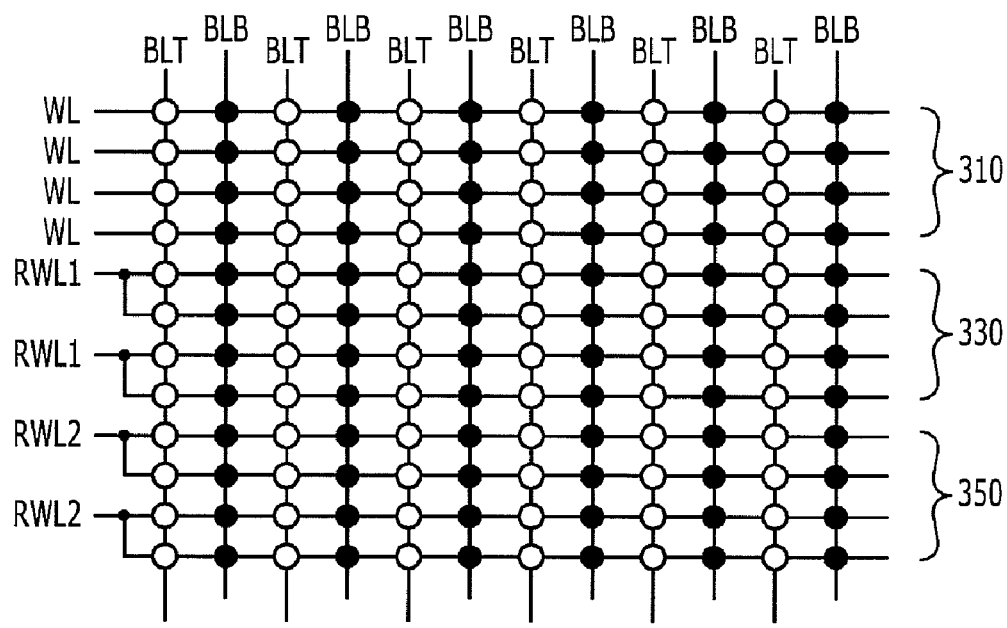
FIG. 3 illustrates a memory cell architecture of a semiconductor memory device in accordance with an embodiment of the present invention.

FIG. 3 illustrates a memory cell architecture of a semiconductor memory device in accordance with an embodiment of the present invention.

Referring to FIG. 3, the semiconductor memory device includes a normal memory cell array 310, a first redundancy memory cell array 330, and a second redundancy memory cell array 350. The normal memory cell array 310 and the first redundancy memory cell array 330 are designed within one memory cell mat, and the second redundancy memory cell array 350 is designed separately from the memory cell mat.

Figure 1:
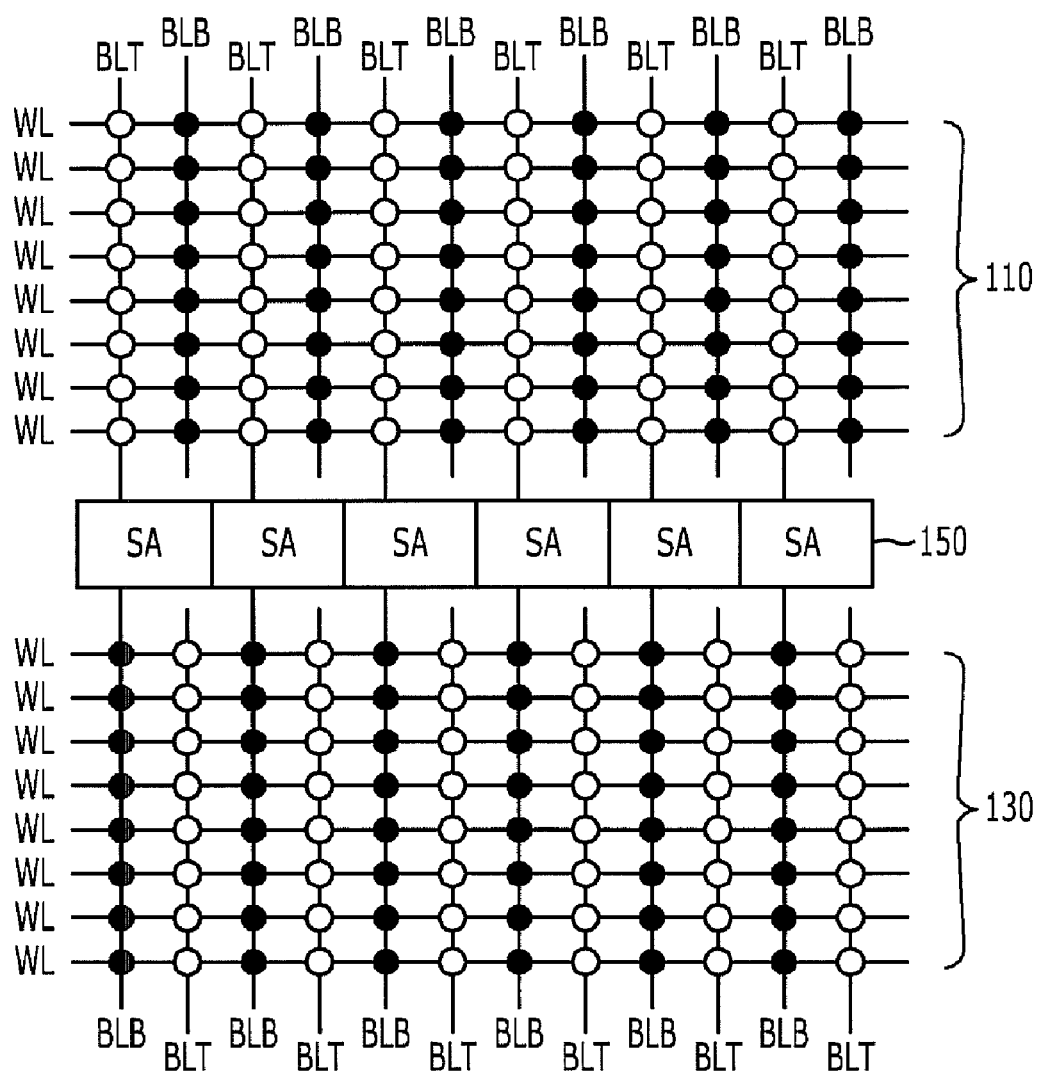
FIG. 1 illustrates a memory cell array architecture of a conventional semiconductor memory device.
Figure 2:
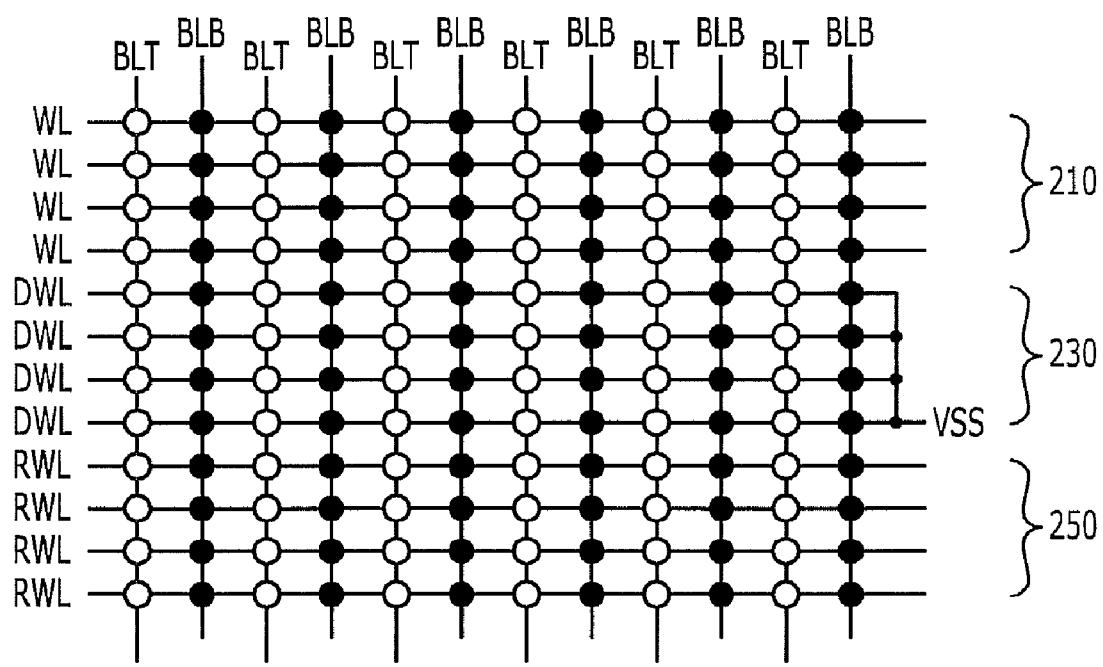
FIG. 2 illustrates a dummy memory cell array and a redundancy memory cell array of a conventional semiconductor memory device.

Compared with the conventional semiconductor memory device of FIG. 2, the architecture of the semiconductor memory device of FIG. 3 has at least the following two additional features.

First, in the conventional redundancy memory cell array 250 of FIG. 2, one redundancy word line RWL is activated in response to the address corresponding to the defective memory cell. However, in the second redundancy memory cell array 350 of FIG. 3 corresponding to the redundancy memory cell array 250 of FIG. 2, the second redundancy word line RWL2 corresponding to the two second redundancy memory cell arrays is activated in response to the address corresponding to the defective memory cell. Two second redundancy word lines RWL2 are illustrated in FIG. 3, and each of the second redundancy word lines RWL2 corresponds to two redundancy memory cell arrays.

The activation of the second redundancy word line RWL2 corresponding to the two second redundancy memory cell arrays has an effect that increases the capacitance of the memory cell corresponding to the activated second redundancy word line RWL2 and thus improves the sensing margin or refresh characteristic of the memory cell. However, such an architecture decreases the number of defective memory cells that can be replaced with the redundancy memory cells.

Second, the number of defective memory cells to be replaced with the redundancy memory cells may be designed to equal that of the prior art. In the case of the conventional dummy memory cell array 230 of FIG. 2, the dummy word line DWL is connected to the ground terminal VSS. However, in the case of the first redundancy memory cell array 330 of FIG. 3 corresponding to the dummy memory cell array 230 of FIG. 2, the first redundancy word line RWL1 corresponding to two first redundancy memory cell arrays is activated in response to the address corresponding to the defective memory cell. Two first redundancy word lines RWL1 are illustrated in FIG. 3, and each of the first redundancy word lines RWL1 corresponds to two redundancy memory cell arrays.

The activation of the first redundancy word line RWL1 corresponding to the two first redundancy memory cell arrays has an effect that increases the capacitance of the memory cell corresponding to the activated first redundancy word line RWL1. Moreover, the decrease in the number of the defective memory cells replaced with the redundancy memory cells due to the first feature that intends to use two existing redundancy memory cells as one redundancy memory cell can be compensated in the first redundancy memory cell array. Thus, the number of the defective memory cells to be replaced with the redundancy memory cells can equal that of the prior art.

In FIG. 2, four defective memory cells are replaced with four redundancy memory cell arrays 250 corresponding to one redundancy memory cell. In accordance with the embodiment of the present invention, however, two defective memory cells among four defective memory cells are replaced with the first redundancy memory cell array 330 corresponding to two first redundancy memory cells, and two remaining defective cells are replaced with two second redundancy memory cell array 350 corresponding to two second redundancy memory cells. That is, four defective memory cells are replaced with the first and second redundancy memory cells having relatively sufficient capacitance.

Since the first redundancy memory cell array 330 corresponds to the existing dummy memory cell array 230, the size of the semiconductor memory device is equal to that of the conventional semiconductor memory device. As in the prior art, four defective memory cells are replaced with the redundancy memory cells having relatively sufficient capacitance.

Figure 4:
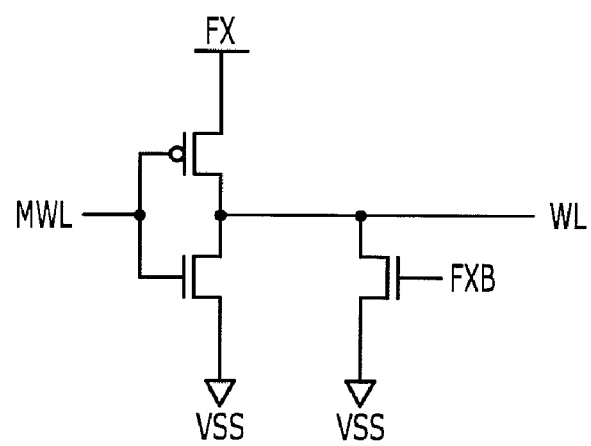
FIG. 4 is a circuit diagram of a decoder for activating a word line of the normal memory cell array of FIG. 3.

FIG. 4 is a circuit diagram of a decoder for activating the word line WL of the normal memory cell array 310 of FIG. 3. For illustration purposes, a circuit configuration corresponding to one word line WL among a plurality of word lines WL will be described below. In other words, the decoder includes a plurality of driving units for activating a plurality of word lines WL, and only one driving unit is illustrated in FIG. 4.

Referring to FIG. 4, the driving unit includes a PMOS transistor and an NMOS transistor each having a gate receiving a main word line selection signal MWL, and an NMOS transistor having a gate receiving an inverted pre-decoding signal FXB. The PMOS transistor of the driving unit transfers a pre-decoding signal FX to a word line WL, and the NMOS transistors are connected between the word line WL and a ground terminal VSS. The main word line selection signal MWL, the pre-decoding signal FX, and the inverted pre-decoding signal FXB are signals corresponding to an address, and the driving unit activates the word line WL in response to the corresponding address.

Meanwhile, the driving unit may be designed to correspond to the first and second redundancy memory cell arrays RWL1 and RWL2. Furthermore, one driving unit may be designed to correspond to one redundancy memory cell array, or one driving unit may be designed to correspond to a plurality of redundancy memory cell arrays.

As mentioned above, relatively sufficient capacitance can be ensured because the redundancy word lines corresponding to a plurality of redundancy memory cell arrays are activated in response to the address corresponding to one defective memory cell. Furthermore, since the existing unused dummy memory cell arrays are used as the additional redundancy memory cell arrays, the number of the defective memory cells can be maintained to be equal to the prior art. Therefore, a desired number of defective memory cells can be replaced with the redundancy memory cells having relatively sufficient capacitance, without increasing the chip size.

In accordance with the embodiments of the present invention, since relatively sufficient capacitance of the redundancy memory cells is ensured, the characteristics of the memory cells can be improved.

Furthermore, by replacing the defective memory cells with the existing unused dummy memory cell arrays, at least a same number of defective memory cells as that of the prior art can be replaced with the redundancy memory cells having relatively sufficient capacitance, without increasing the size of the semiconductor memory device.

Moreover, the improved characteristics of the memory cells due to the sufficient capacitance can improve the operating characteristics such as the sensing margin or refresh of the memory cells.

While the present invention has been described with respect to the specific embodiments, it will be apparent to those skilled in the art that various changes and modifications may be made without departing from the spirit and scope of the invention as defined in the following claims.

Moreover, the positions and types of the logic gates and transistors described above will be changed according to polarities of input signals.

What is claimed is:

1. A semiconductor memory device, comprising:
   a plurality of memory cell mats each comprising a plurality of normal memory cell arrays; and
   a redundancy memory cell array configured to replace a defective memory cell with a plurality of redundancy memory cells corresponding to a redundancy word line when the redundancy word line corresponding to one or more redundancy memory cell arrays is activated in response to an address corresponding to the defective memory cell among the plurality of normal memory cell arrays.

2. The semiconductor memory device of claim 1, further comprising a word line driving unit configured to activate the redundancy word line in response to the address corresponding to the defective memory cell.

3. The semiconductor memory device of claim 1, wherein the plurality of memory cell mats has an open bit line architecture.

4. A semiconductor memory device having a plurality of memory cell mats each having a number of memory cells greater than $2^n$ and less than $2^{n+1}$ (where n is a natural number), the semiconductor memory device comprising:
   a first redundancy memory cell array comprising a plurality of first memory cell arrays included in the plurality of memory cell mats, and configured to replace a first defective memory cell with a plurality of first redundancy memory cells corresponding to a first redundancy word line when the first redundancy word line corresponding to two or more first memory cell arrays among the plurality of first memory cell arrays is activated in response to an address corresponding to the first defective memory cell; and
   a second redundancy memory cell array comprising a plurality of second memory cell arrays that are not included in the plurality of memory cell mats, and configured to replace a second defective memory cell with a plurality of second redundancy memory cells corresponding to a second redundancy word line when the second redundancy word line corresponding to two or more second memory cell arrays among the plurality of second memory cell arrays is activated in response to an address corresponding to the second defective memory cell.

5. The semiconductor memory device of claim 4, wherein the plurality of memory cell mats comprise $2^m$ memory cell arrays (where m is number of address bits), and the semiconductor memory device further comprises a normal memory cell array that performs an access operation on a normal memory cell when one normal word line is activated in response to the address.

6. The semiconductor memory device of claim 4, further comprising:
   a first word line driving unit configured to activate the first redundancy word line in response to the address corresponding to the first defective memory cell; and
   a second word line driving unit configured to activate the second redundancy word line in response to the address corresponding to the second defective memory cell.

7. The semiconductor memory device of claim 4, wherein the plurality of memory cell mats has an open bit line architecture.

* * * * *